(12) United States Patent
Rye et al.

(10) Patent No.: US 9,799,537 B2
(45) Date of Patent: Oct. 24, 2017

(54) PROCESSING ASSEMBLY FOR SEMICONDUCTOR WORKPIECE AND METHODS OF PROCESSING SAME

(75) Inventors: Jason Rye, Kalispell, MT (US); Kyle M. Hanson, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 33 days.

(21) Appl. No.: 12/960,378

(22) Filed: Dec. 3, 2010

(65) Prior Publication Data
US 2012/0138091 A1 Jun. 7, 2012

(51) Int. Cl.
*H01L 21/02* (2006.01)
*H01L 21/67* (2006.01)
*H01L 21/687* (2006.01)
*B08B 3/04* (2006.01)

(52) U.S. Cl.
CPC .... *H01L 21/67051* (2013.01); *H01L 21/6719* (2013.01); *H01L 21/68792* (2013.01)

(58) Field of Classification Search
CPC ......... H01L 21/68792; H01L 21/68785; H01L 21/67051; H01L 21/6719
USPC ................................................. 134/149, 902
See application file for complete search history.

(56) References Cited

U.S. PATENT DOCUMENTS

| 6,012,192 | A | * | 1/2000 | Sawada | H01L 21/67046 |
| | | | | | 134/153 |
| 6,132,113 | A | * | 10/2000 | Yu et al. | 396/611 |
| 6,281,145 | B1 | * | 8/2001 | Deguchi et al. | 438/782 |
| 6,431,948 | B1 | * | 8/2002 | Atoh | B08B 1/04 |
| | | | | | 134/902 |
| 6,827,814 | B2 | * | 12/2004 | Taniyama | H01L 21/6708 |
| | | | | | 134/113 |
| 6,919,115 | B2 | * | 7/2005 | Foster | 428/36.9 |
| 7,416,632 | B2 | | 8/2008 | Orii | |
| 8,268,087 | B2 | * | 9/2012 | Kamikawa et al. | 134/33 |
| 2002/0006876 | A1 | | 1/2002 | Hongo | |
| 2003/0089608 | A1 | | 5/2003 | Kumekawa | |
| 2004/0253833 | A1 | | 12/2004 | Takehiko | |

(Continued)

FOREIGN PATENT DOCUMENTS

CN 101060070 A 10/2007
KR 757911 B1 9/2007

(Continued)

OTHER PUBLICATIONS

English translation of Chinese Office Action mailed Jan. 18, 2016, issued in corresponding Chinese Patent Ap No. 201180059556.2 filed Dec. 2, 2011 and listed in Applicant's IDS dated Feb. 12, 2016.*

(Continued)

*Primary Examiner* — Douglas Lee
(74) *Attorney, Agent, or Firm* — Christensen O'Connor Johnson Kindness PLLC (57) ABSTRACT

A processing assembly for a semiconductor workpiece generally includes a rotor assembly capable of spinning a workpiece, a chemistry delivery assembly for delivering chemistry to the workpiece, and a chemistry collection assembly for collecting spent chemistry from the workpiece. The chemistry collection assembly may include a weir that is configured to spin with the rotor assembly. A method of processing a semiconductor workpiece is also provided.

12 Claims, 6 Drawing Sheets

(56) References Cited

U.S. PATENT DOCUMENTS

| | | | |
|---|---|---|---|
| 2007/0110895 A1* | 5/2007 | Rye | H01L 21/67051 427/240 |
| 2007/0240638 A1* | 10/2007 | Akimoto | H01L 21/67051 118/52 |
| 2007/0240824 A1* | 10/2007 | Kaneko et al. | 156/345.11 |
| 2007/0270080 A1* | 11/2007 | Barada | B24B 37/30 451/5 |
| 2009/0056766 A1 | 3/2009 | Nanba | |

FOREIGN PATENT DOCUMENTS

| | | |
|---|---|---|
| KR | 797081 B1 | 1/2008 |
| KR | 2009029408 A | 3/2009 |
| KR | 2010045802 A | 5/2010 |
| KR | 2010046800 A | 5/2010 |
| WO | 2009084406 A1 | 7/2009 |
| WO | WO 2009084406 A1 * | 7/2009 |

OTHER PUBLICATIONS

International Search Report and Written Opinion mailed Jul. 31, 2012, issued in International Application No. PCT/US2011/063135, filed Dec. 2, 2011, 14 pages.

International Search Report and Written Opinion mailed Jul. 31, 2012, issued in corresponding International Application No. PCT/US2011/063145, filed Dec. 2, 2011, 11 pages.

Search Report mailed Oct. 27, 2015, issued in corresponding Taiwanese Patent Application No. 100144328, filed Dec. 2, 2011, 5 pages.

Chinese Office Action mailed Jan. 18, 2016, issued in corresponding Chinese Patent Application No. 201180059556.2, filed Dec. 2, 2011, 15 pages.

* cited by examiner

PROCESSING ASSEMBLY FOR SEMICONDUCTOR WORKPIECE AND METHODS OF PROCESSING SAME

BACKGROUND

In general, semiconductor devices are manufactured by fabrication processes that form electric circuits on a semiconductor substrate, such as a silicon wafer. The fabrication processes usually include various sequences of different process steps, such as deposition, planarizing, photolithography, and ion implantation. Cleaning (such as etching and rinsing) steps are carried out between the various processing steps to remove contaminants from the substrate.

For example, copper is commonly deposited on silicon wafers in semiconductor fabrication. It is well known, however, that copper ions act as a contaminate in semiconductor fabrication. In that regard, copper ions, will diffuse into the silicon and change the conductivity of the silicon. Moreover, copper deposition at the bevel can flake and be unstable and therefore usually requires some etching. Therefore, copper ions are preferably cleaned or etched from all surfaces of the workpiece after a copper deposition process so as to prevent contamination and/or unwanted flaking.

A typical copper cleaning solution for semiconductors is dilute sulfuric peroxide chemistry. This chemistry, or other cleaning solutions, may be used to clean the back side of the workpiece, around the edge (bevel), and on other specific areas on the front side.

In previously designed chambers, masked areas on the wafer prevented the wafer from being fully exposed to the cleaning chemistry, which resulted in contamination. In addition, chemistry collection areas in the chamber for collecting spent cleaning chemistry were not optimized to prevent chemical splash, also resulting in contamination undesirable etching, for example, etching of the front or back side surfaces during the bevel etch process. Moreover, chemistry collection was not optimized for recovery and reuse.

Therefore, there exists a need for a chamber designed to clean a workpiece with reduced masking and improved chemistry collection techniques to minimize splashing and optimize recovery.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a processing assembly for a semiconductor workpiece is provided. The processing assembly generally includes a rotor assembly configured for spinning a workpiece, a chemistry delivery assembly for delivering chemistry to the workpiece, and a chemistry collection assembly for collecting spent chemistry from the workpiece. The chemistry collection assembly includes a weir that is configured to spin with the rotor assembly.

In accordance with another embodiment of the present disclosure, a processing assembly for a semiconductor workpiece is provided. The processing assembly generally includes a rotor assembly capable of spinning a workpiece, the rotor assembly including first and second rotors. The first rotor is movable to adjust the axial spacing between a first workpiece receiving portion on the first rotor and a second workpiece receiving portion on the second rotor, and the first rotor includes a vortex cavity that creates a pressure differential for forcing the workpiece on either of the first or second workpiece receiving portions. The processing assembly further includes a chemistry delivery assembly for delivery chemistry to the workpiece, and a chemistry collection assembly for collecting spent chemistry from the workpiece.

In accordance with another embodiment of the present disclosure, a method for processing a semiconductor workpiece is provided. The method generally includes delivering chemistry to a workpiece in a first process step when the workpiece is on a first rotor. The method further includes transferring the workpiece from the first rotor to a second rotor, and delivering chemistry to the workpiece in a second process step when the workpiece is on the second rotor. The method further includes collecting spent chemistry from the workpiece in a spinning weir when the workpiece is on either of the first and second rotors.

DESCRIPTION OF THE DRAWINGS

The foregoing aspects and many of the attendant advantages of this disclosure will become more readily appreciated by reference to the following detailed description, when taken in conjunction with the accompanying drawings, wherein.

DETAILED DESCRIPTION

Embodiments of the present disclosure are directed to processing assemblies for processing a workpiece, such as a semiconductor wafer, and methods of processing the same. The term workpiece, wafer, or semiconductor wafer means any flat media or article, including semiconductor wafers and other substrates or wafers, glass, mask, and optical or memory media, MEMS substrates, or any other workpiece having micro-electric, micro-mechanical, or microelectromechanical devices.

A processing assembly 10 constructed in accordance with one embodiment of the present disclosure may be best understood by referring to FIGS. 1-4. The processing assembly 10 has an outer wall 20 defining an inner processing chamber 22, and a positionable rotor assembly 24 for receiving, positioning, and spinning a workpiece W disposed within the processing chamber 22. The processing assembly 10 further includes a chemistry delivery assembly 26 for delivering chemistry to the workpiece W and a chemistry collection assembly 28 for collecting and either disposing of or recycling the used chemistry.

Although shown and described as being directed to a cleaning or etching assembly designed for cleaning semiconductor workpieces, it should be appreciated that embodiments of the present disclosure may be applicable in other non-cleaning semiconductor fabrication applications. Spatially relative terms used herein, for example, top, front, bottom, back high, intermediate, low, up, down, upwardly, downwardly, etc., are used to simplify the description of the illustrated embodiment for the reader and are not intended to be limiting.

Figure 4:
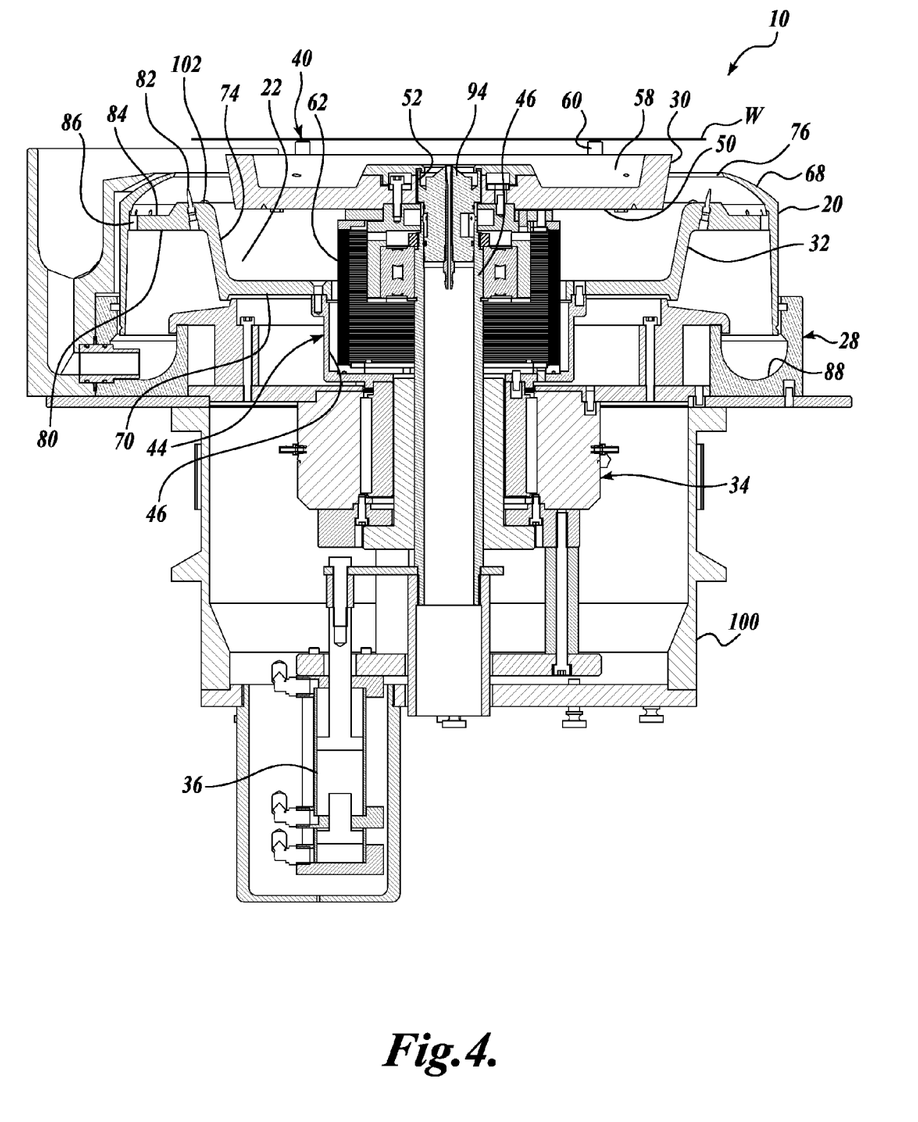
FIG. 4 is a cross-sectional view of the portion of the processing assembly shown in FIG. 2, wherein the rotor assembly is in a first position for receiving a workpiece.
Figure 5:
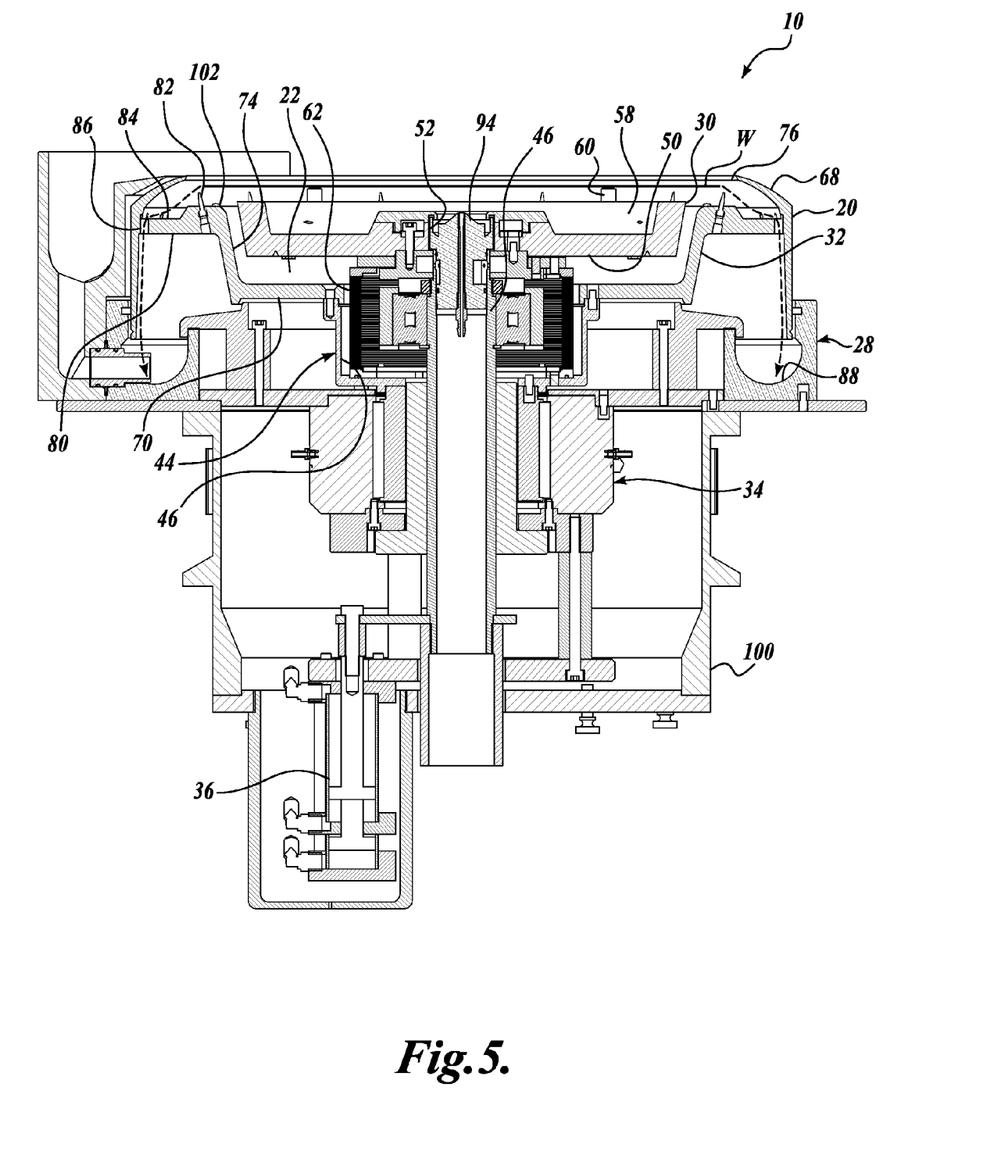
FIG. 5 is a cross-sectional view of the portion of the processing assembly shown in FIG. 2, wherein the rotor assembly is in a second position for processing a workpiece.
Figure 6:
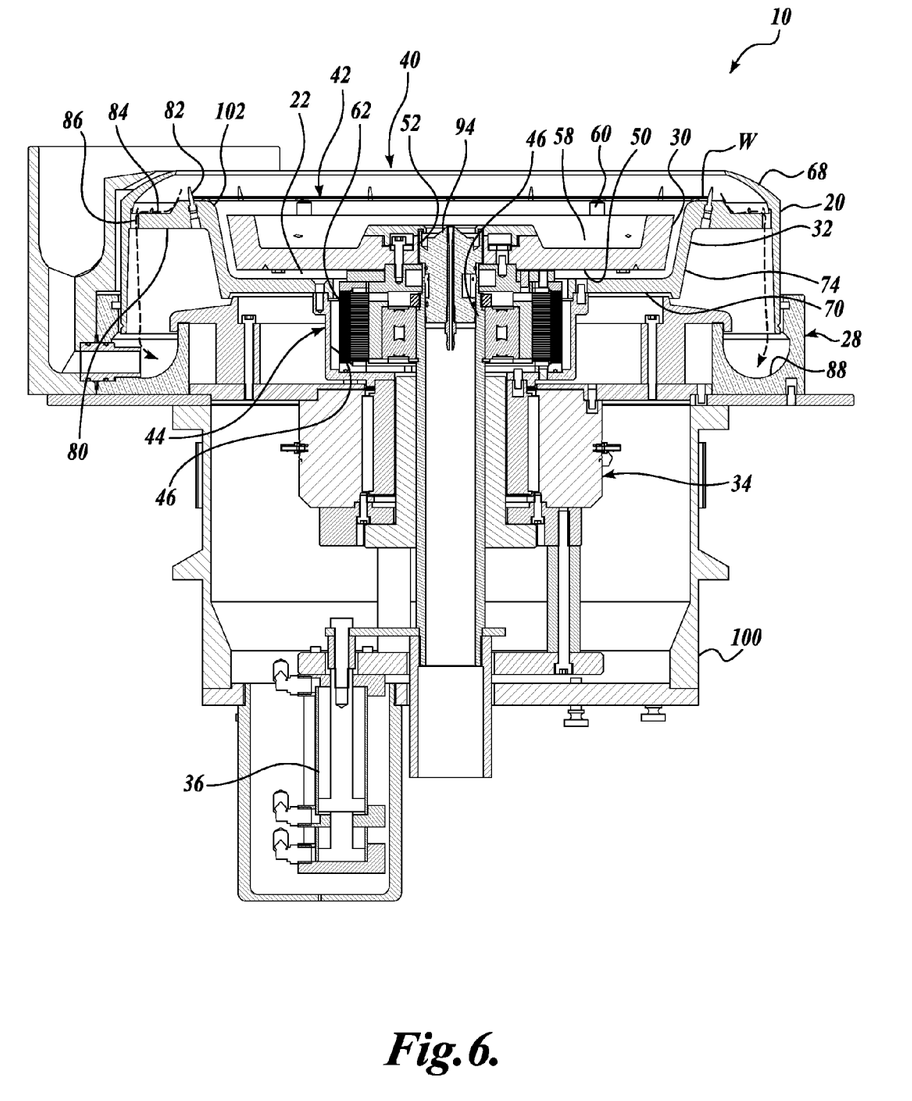
FIG. 6 is a cross-sectional view of the portion of the processing assembly shown in FIG. 2, wherein the rotor assembly is in a third position for processing a workpiece.

The rotor assembly 24 is configurable in a plurality of positions to achieve various processing results for a workpiece W (for example, see FIGS. 4-6). The workpiece W is received in the processing assembly 10 when the rotor assembly 24 is in an automation position, e.g., a first position (see FIG. 4). After the workpiece W has been received, the rotor assembly 24 can be moved through a series of process steps in processing positions, e.g., second and third positions, for processing the workpiece W (see FIGS. 5 and 6). Generally speaking, the workpiece outer edge (bevel) and top surface (front side) can be fully processed when the rotor assembly 24 is in the second position (see FIG. 5), and the workpiece bottom surface (back side) can be fully processed when the rotor assembly travels through both the second and third positions (see FIGS. 5 and 6), as described in greater detail below.

Figure 2:
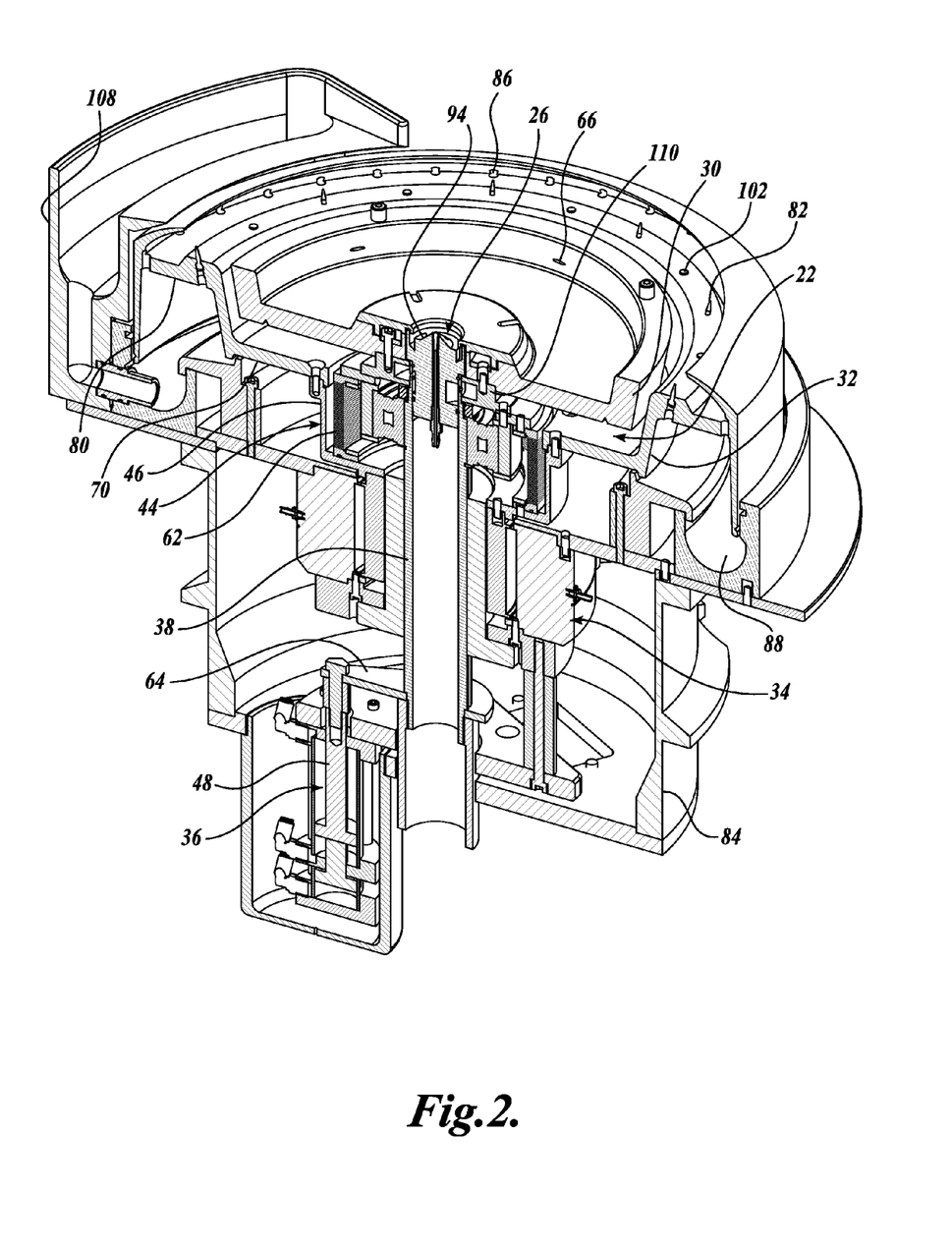
FIG. 2 is a cross-sectional isometric view of a portion of the processing assembly of FIG. 1.
Figure 3:
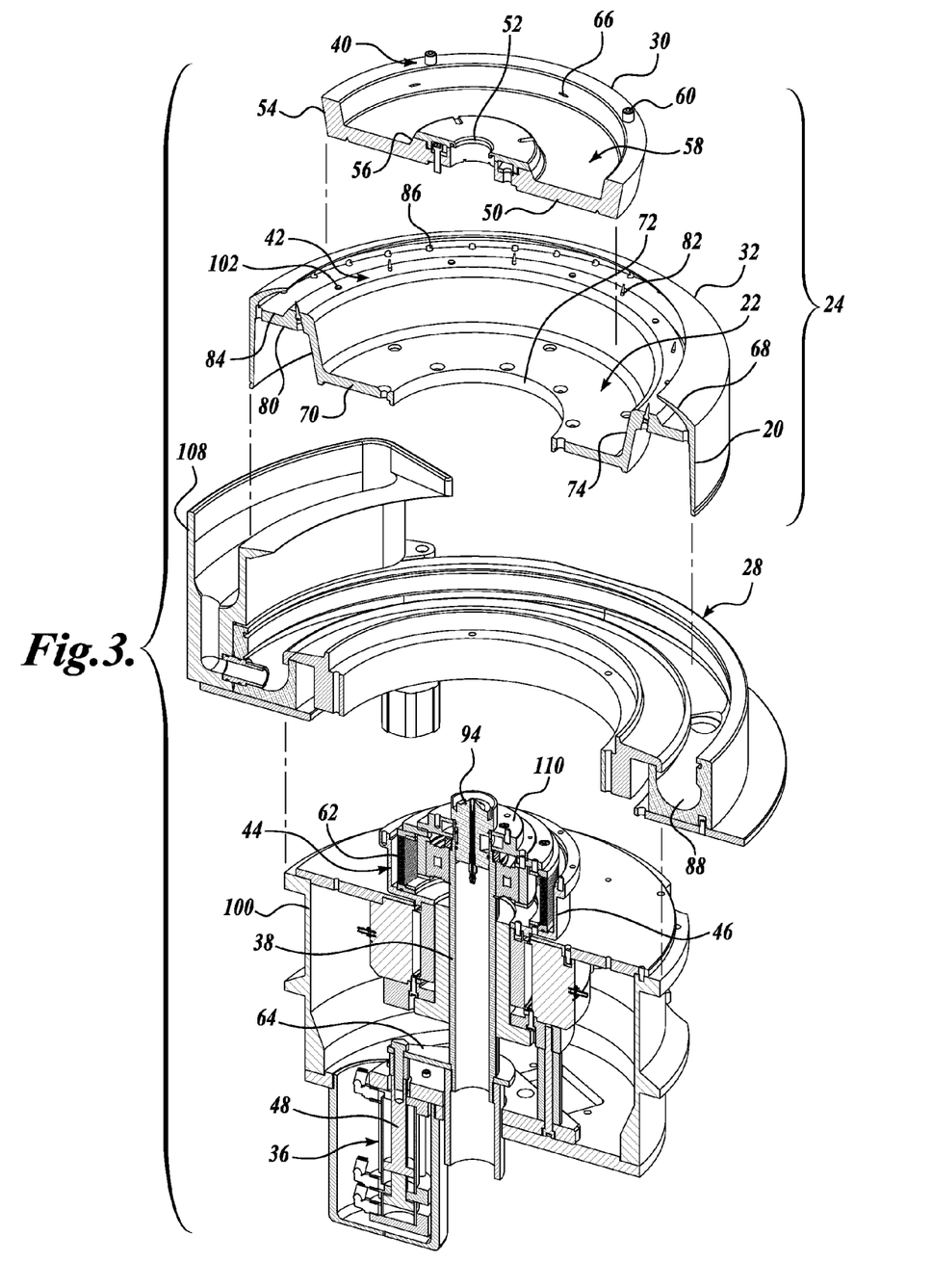
FIG. 3 is a partial cross-sectional exploded view of the portion of the processing assembly of FIG. 2.

The rotor assembly 24 will now be described. Referring to FIGS. 2 and 3, the rotor assembly 24 generally includes concentric first and second rotors 30 and 32 for receiving, positioning, and spinning a workpiece W (workpiece W shown in FIG. 4). A driving assembly 34 rotates rotors 30 and 32 around a center shaft 38, and an actuating assembly 36 transmits linear movement to at least a portion of the rotor assembly 24. As can be seen in FIGS. 2 and 3, both the driving assembly 34 and the actuating assembly 36 are contained within a lower housing portion 100, which is designed to protect these components from the chemistry that runs through the inner chamber 22 of the processing assembly 10 or other environmental contamination.

The driving assembly 34 includes a spinning motor for driving the rotor assembly 24 via a transmission assembly 44. The transmission assembly 44 includes a first coupler 46, and a second coupler 62. The upper edge of the first coupler 46 is coupled to the base portion 70 of the second rotor 32 for transmitting torque to the second rotor 32. The first coupler 46 then transmits torque to the first rotor 30 via the second coupler 62. In the illustrated embodiment, the first coupler 46 also serves as a protective housing for the second coupler 62.

The second coupler 62 is an expandable coupling device, as seen by comparing the sizing of the second coupler 62 in FIGS. 4-6. As a non-limiting example, the second coupler 62 may be an accordion style bellows made from a polymer material, such as a fluorocarbon polymer, polypropylene, or polyethylene. Suitable polymers may include, but are not limited to, polytetrafluoroethylene (PTFE), perfluoroalkoxy (PFA), fluorinated ethylene propylene (FEP), polyvinylidene fluoride (PVDF), ethylene chlorotrifluoroethylene (ECTFE), polychlorotrifluoroethylene (PCTFE), and ethylene tetrafluoroethylene (ETFE). In one non-limiting example, the second coupler is a PTFE bellows having a wall thickness of about 0.015 inches or greater.

The expandable polymer coupler 62 provides an acid proof barrier between the chemistry in the processing chamber 22 and the center shaft 38. In that regard, the center shaft 38 is typically made from metal, may be lubricated, and may include a ball bearing component. Therefore, the shielding second coupler 62 prevents fluid or other contamination in the center shaft 38, which if allowed to occur, may cause part failure. Because the second coupler 62 is expandable it protects the center shaft 38 as the rotor assembly 24 is actuated through its various positions (see FIGS. 4-6).

The inventors determined that the second coupler 62, when made from a polymer material, has enough stiffness to transmit torque to the first rotor 30 from the second coupler 46. As seen in FIG. 4, the second coupler 62 can also provide an inner wall defining the inner cavity 78 of the second rotor 32.

The center shaft 38 moves axially, but it does not rotate. Therefore, the rotors 30 and 32 spin around the center shaft 38. As seen in FIGS. 2 and 3, the center shaft 38 is a hollow shaft configured to receive other elements or instruments for processing the workpiece W. For example, as seen in the illustrated embodiment, the shaft 38 houses nozzle 94 of the chemistry delivery assembly 26 for chemistry delivery to the back side of the workpiece W, as described in greater detail below.

The actuating assembly 36 is coupled to the rotor assembly 24 for actuating the rotor assembly 24 to change the relative positioning of first and second workpiece receiving portions 40 and 42 of the respective first and second rotors 30 and 32. For example, compare the positioning of the first and second workpiece receiving portions 40 and 42 in FIGS. 4-6.

The actuating assembly 36 includes an actuator 48 to raise and lower arm 64, which is coupled to the center shaft 38. Non-limiting examples of a suitable actuator include a pneumatic actuator and a servo-driven actuator. The center shaft 38 includes a coupling portion 110 for coupling with the first rotor 30. Via arm 64, actuator 48 transmits linear movement (e.g., up and down movement) to the first rotor 30. As a non-limiting example, the actuating device may be a ball spline.

In the illustrated embodiment, the actuating assembly 36 is configured to transmit linear movement only to the first rotor 30, and not to the second rotor 32. In that regard, the first rotor 30 is coupled to the center shaft 38, but the second rotor 32 is not coupled to the center shaft 38 and merely rotates around the center shaft 38. However, in other embodiments of the present disclosure, the actuating assembly 36 may be configured to transmit linear movement to the second rotor 32, or the actuating assembly 36 may be configured to independently move either or both of the first and second rotors 30 and 32 to change the axial spacing.

The first and second rotors 30 and 32 are designed and configured such that the rotor assembly 24 can be positioned in various orientations to change the axial spacing between the workpiece receiving portions 40 and 42 of the respective first and second rotors 30 and 32. In the illustrated embodiment, the rotor assembly 24 is positionable in at least three orientations, as follows:

(1) first rotor 30 "high" relative to second rotor 32, which is selected for receiving or transferring a workpiece W to or from the processing chamber 22 (see FIG. 4);

(2) first rotor 30 "intermediate" relative to second rotor 32, which is selected for generally processing the outer edge or bevel of the workpiece W, the front side or top surface of the workpiece W, as well as the back side or bottom surface of the workpiece W (see FIG. 5); and (3) first rotor 30 "low" relative to second rotor 32, which is generally selected for generally processing the backside or bottom surface of the workpiece W (see FIG. 6).

Although the illustrated embodiment is shown and described as moving the first rotor 30 to three different positions relative to a fixed second rotor 32, it should be appreciated that the various positions result in a change in axial spacing between the first and second workpiece receiving portions 40 and 42. Therefore, it should be appreciated that other embodiments directed to moving the second rotor 32 relative to a fixed first rotor 30 or moving both rotors 30 and 32 independent of one another to achieve variations in axial spacing are also within the scope of the present disclosure.

The first rotor 30 is a chuck rotor for receiving and supporting the workpiece W. Referring to FIG. 3, the first rotor 30 has a base portion 50 defining a center hole 52 through which the shaft 38 is received. The shaft 38 couples to the base portion 50 via shaft coupling portion 110 and aligns with the center hole 52 of the base portion 50. Therefore, various elements or instruments disposed within the hollow shaft 38 (such as nozzle 94 of the chemistry delivery assembly 26) have access to the back or bottom surface of the workpiece W when it is received on the first rotor 30. The first rotor 30 further includes an annular outer sidewall 54 along the outer perimeter of the base 50 and an annular inner sidewall 56, wherein the sidewalls 54 and 56 define a cavity 58 adjacent the base 50 (see cavity 58 in FIG. 4). Along the inner surface of the outer sidewall 54, the first rotor 30 includes a plurality of ports 66 for delivering vortex generating gas to the cavity 58, as described in greater detail below.

The first rotor 30 includes the first workpiece receiving portion 40 (see FIG. 4). In the illustrated embodiment, the workpiece receiving portion 40 includes a plurality of standoffs 60 extending upwardly from the outer sidewall 54 for receiving and supporting the workpiece W. The standoffs 60 are configured for contacting the workpiece W on its back side. In the illustrated embodiment, the first rotor 30 includes four standoffs 60 (see FIG. 1); however it should be appreciated that any suitable number of standoffs 60 are within the scope of the present disclosure. The standoffs 60 serve to create spacing between the outer sidewall 54 and the workpiece W when the workpiece W is forced against the first rotor 30. Such spacing allows for optimized chemistry delivery to the back side of the workpiece W through the shaft 38 for back side cleaning, as described in greater detail below.

When the first rotor 30 has received a workpiece W, two forces acting in concert keep the workpiece W on the first workpiece receiving portion 40 of the first rotor 30 and overcome any centrifugal forces (if the workpiece W is spinning) that might force the workpiece W to deviate from its center position. First, the frictional force between the workpiece W and the standoffs 60 maintain the workpiece W on the first workpiece receiving portion 40.

Second, a pressure differential is also used to maintain the workpiece W in position on the first rotor 30. In that regard, the first rotor 30 is capable of generating a vortex force in cavity 58, i.e., creating a relatively low pressure area below the workpiece W compared to above the workpiece W to provide a force parallel to the direction of the central axis of the first rotor 30 (i.e., orthogonal to the top surface of the workpiece W) to essentially force the workpiece W against the first rotor 30. A suitable vortex rotor is described in U.S. Patent Publication No. US 2007/0110895, published on May 17, 2007, the disclosure of which is hereby expressly incorporated by reference.

In the illustrated embodiment, gas flows into the vortex cavity 58 through ports 66 that are oriented tangentially along the perimeter of the cavity 58. The jets of gas that flow from the ports 66 create a circular path, like a tornado, generating a negative pressure region at the center of the vortex. The negative pressure of the vortex creates a pressure differential between the atmosphere and the cavity 58 to essentially force the workpiece W against the first rotor 30. As will be described in greater detail below, the vortex is a proximate vortex designed to create a pressure differential that maintains the positioning of the workpiece W at variable distances relative to the cavity 58 of the first rotor 30 (for example, at the various positions shown in FIGS. 4-6).

Typically, nitrogen is used as a vortex gas because it is an inert gas that not only lowers the risk of contamination in the processing assembly, but also eliminates oxygen to reduce the explosion potential in the chamber. However, it should be appreciated that other inert gases, such as helium, are also within the scope of the present disclosure. Moreover, non-inert gases, such as air, may also be used if contamination and explosion potential risks are not of concern.

The second rotor 32 is a centering rotor for centering the workpiece W in the processing assembly 10. As seen in FIG. 3, the second rotor 32 defines an inner cavity that is the inner chamber 22 of the processing assembly 10. In that regard, the outer wall 20 of the second rotor 32 (which is the outer wall 20 of the processing chamber 22) includes a vertical portion and a rounded upper portion 68. At the top end of the rounded portion 68 the outer wall 22 defines an annular inlet 76 (see FIG. 4) to the processing chamber 22 through which a workpiece W may enter for processing (see the series of FIGS. 4 and 5, which show, respectively, a workpiece W outside and inside the chamber 22).

Confined by the outer wall 20, the inner chamber 22 of the second rotor 32 is defined by a base portion 70 defining a center hole 72 through which the shaft 38, second coupler 62, and first coupler 46 are received. Like the first rotor 30, the shaft 38 aligns with the center hole 72 such that various elements or instruments (such as nozzle 94 of the chemistry delivery assembly 26) have access to the back or bottom surface of the workpiece W when it is received on either the first or second rotor 30 or 32. The second rotor 32 further includes an annular sidewall 74 along the outer perimeter of the base 70. As described above, the transmission 62 provides an inner wall for the inner chamber 22. Therefore, the base portion 70, sidewall 74, and the transmission 62 define the inner chamber 22 adjacent the base 70 (see inner chamber 22 in FIG. 4).

The inner chamber 22 within the second rotor 32 is configured for receiving the first rotor 30 and a workpiece W for processing. In that regard, the first rotor 30 has an outer circumference that is smaller than the inner circumference of the annular sidewall 74 of the second rotor 32, and therefore is designed to nest within the chamber 22 defined by the second rotor 32. As a result of the nesting capability of the first and second rotors 30 and 32, the first rotor 30 is able to move axially relative to the second rotor 32, as seen in the series of positions of the rotor assembly 24 shown in FIGS. 4-6. The nesting capability of the first and second rotors 30 and 32 allows for compact sizing of the inner chamber 22 to accommodate both rotors 30 and 32, resulting in processing and manufacturing efficiencies as a result of such compact sizing.

Extending laterally outward from the upper end of sidewall 74, the second rotor 32 further includes a rim 80 for supporting the second workpiece receiving portion 42 (see FIG. 6). In the illustrated embodiment, the second workpiece receiving portion 42 includes a plurality of centering guide posts 82 and a plurality of standoffs 102 extending upwardly from the rim 80. The guide posts 82 are oriented at a slight angle away from the central axis of the second rotor 32 and located along the rim 80 at locations that approximate the circumference of an imaginary workpiece W. The guide posts 82 are configured to receive and contact a workpiece W on the outer bevel of the workpiece W. In the illustrated embodiment, the second rotor 32 includes ten guide posts 82 and ten standoffs 102; however, it should be appreciated that any number of guide posts and standoffs is in accordance with embodiments of the present disclosure.

When a workpiece W is received by the guide posts 82, gravity forces the workpiece W downward against the angled guide posts 82. Therefore, as the workpiece W is received by the guide posts 82, it becomes centered between the guide posts 82, in both axial and radial directions, and the guideposts 82 minimize any side-to-side movement. Such centering improves the concentricity of a processed workpiece W, that is, the consistency of the average bevel clean or etch width and the range for minimum and maximum widths.

As seen in FIG. 6, as the workpiece W approaches the bottom of the guide posts 82, it is centered and set to rest on standoffs 102. The standoff 102 allow for a spacing between the rim 80 of the second rotor 32 and the workpiece W when the workpiece W is in the third position (see FIG. 6), such that spent chemistry from back side cleaning can escape to the chemistry collection assembly 28.

It should be appreciated that the standoffs 102 on the second rotor 32 contact the workpiece W in different locations than the standoffs 60 on the first rotor 30. Such a guide post 82 centering mechanism is advantageous because the workpiece W always has a centered fit within the guide posts 82. Moreover, in such a guide post 82 centering mechanism, only select portions of the bevel and back side regions of the workpiece W are contacted by, respectively, the centering guideposts 82 and the standoffs 102, allowing for the other surfaces of the workpiece W to be subjected to processing.

In addition to the guide posts 82 along the outer perimeter of the second rotor 32, a frictional force and pressure differential are also used to maintain the workpiece W in position on the second rotor 32 when the rotor assembly 24 is spinning, as described with reference to the first rotor 30. Regarding the pressure differential, the vortex cavity 58 of the nested first rotor 30 is a proximate vortex that can also be used to force the workpiece W against the second rotor 32. In that regard, the vortex cavity 58 is capable of holding and maintaining a workpiece W for up to about 6 inches in distance from the vortex. This can be contrasted with a standard Bernoulli chuck which does not work with changing proximity more than about 0.080 inch. Therefore, the nesting capability allows for the rotor assembly 24 to use the vortex cavity 58 of the first rotor 30 for holding a workpiece W that is received on either of the first or second receiving portions 40 or 42 of the respective first or second rotors 30 or 32.

Referring to FIGS. 3 and 4, the rotor assembly 24 further includes a chemistry collection assembly 28 that collects spent fluids for either waste or recycle. The chemistry collection assembly 28 includes a weir 84 that is fixedly attached and configured to spin with the second rotor 32. In that regard, the weir 84 is a chemistry receiving channel that extends radially from the rim 80 of the second rotor 32. Weir 84 is formed by the upper portion 68 of outer wall 20 and the extension from the top surface of rim 80. The weir 84 may be configured to be angled downwardly such that chemistry is directed radially outwardly toward wall 20 and does not pool on the rim 80 the second rotor 32. From the weir 84, the chemistry travels from the edge of the second rotor 32 through the drain holes 86 at the outer annular edge of the second rotor 32 near the inner surface of wall 20 (see arrows in FIGS. 5 and 6).

The draining chemistry is collected in a fixed (non-spinning) collection chamber 88 positioned below the drain holes 86. Chemistry may be removed from the collection chamber 88 at the drains 104 into the drain valve assembly 106 (see FIG. 1). The chemistry collection assembly 28 further includes a swing arm dispense cup 108 for dispensing chemistry into the collection chamber 88 after flushing the swing arm assemblies 90 and 92 before starting up the processing assembly 10.

Because the weir 84 is a "spinning" weir, that is, fixedly attached to the second rotor 32, the collection assembly 28 results in enhanced chemistry collection over previous non-spinning designs. In previously designed systems having non-spinning weirs, chemistry that spins off the workpiece W as a result of centrifugal forces has radial and tangential components. The tangential component of the spin-off chemistry is the major portion of the spin-off chemistry. The tangential component hits the inner surface of the wall 20, for example, at the rounded portion 68 and beads up on the surface. As chemistry continues to hit the beaded surface, chemistry splatters and turns into an aerosol. Such aerosol, if left to settle on surfaces both inside and outside the processing chamber 22, will contaminate those surfaces with spent chemistry. Therefore, the aerosol must be captured by an exhaust system to prevent such contamination.

In accordance with embodiments of the present disclosure, the weir 84 and the outer wall 20 spin together with the rotor assembly 24, thereby negating the tangential component of the spin-off chemistry. With a straight radial component, the inventors have found that beading on the inner surface of the chamber wall 20 is substantially reduced, if not eliminated, creating less chemistry spattering and less resultant aerosol, both inside and outside the processing chamber 22. A reduction in aerosol results in a reduced need for exhaust systems both inside and outside the processing chamber 22. In addition, by eliminating beading on the inner surface of the chamber wall 20, centrifugal force acts on the collected fluid to cause the fluid to flow toward drain holes 86, thereby limiting the volume of fluid that collects on the collection surface of weir 84.

In addition to the reduction of chemistry spattering, the "spinning" weir has the added advantage of being cleanable after each processing step. Because the weir spins, it can readily be rinsed during processing to accommodate different chemistries. As a non-limiting example, the "spinning" weir allows for the collection of an etching chemistry for recovery and recycle immediately after collecting a rinsing chemistry without contaminating the etching chemistry. In a "non-spinning" weir assembly, for example, the weir assembly described in co-pending U.S. patent application Ser. No. 12/960,372, filed on Dec. 3, 2010, the disclosure of which is hereby expressly incorporated by reference, the weirs cannot be easily cleaned, and therefore, require a plurality of weirs in a weir assembly in order to collect chemistry for recycle.

In the illustrated embodiment, the collection chamber 88 is not configured to spin with the second rotor 32, and therefore there is some resultant spattering and aerosol formed in the collection chamber 88. However, because the collection chamber 88 is removed from the processing chamber 22, the spattering does not affect the condition of the workpiece.

A chemistry delivery assembly 26 delivers fluids to various locations on the workpiece, including the front side, the bevel, and the back side. The chemistry delivery assembly 26 includes a front side delivery system, which may include one or more delivery swing arms 90 and 92 (see FIG. 1). For example, the workpiece outer edge (bevel) may be processed using, for example, a short swing arm assembly 90 of the chemistry delivery assembly 26. The workpiece top surface (front side) may be processed using, for example, a long swing arm assembly 92 of the chemistry delivery assembly 26. The chemistry delivery assembly 26 further includes a back side delivery system. In the illustrated embodiment, the back side delivery system is a back side delivery nozzle 94 located in the shaft 38 for delivering chemistry to the back side of the workpiece W.

As mentioned above, the rotor assembly 24 is configurable in a plurality of positions, i.e., first (FIG. 4), second (FIG. 5), and third (FIG. 6) positions, to achieve various processing results for the workpiece. An exemplary operational sequence for the processing assembly 10 will now be described, wherein the workpiece W transitions from the first position to the third position, then to the second position, then back to the third position, then back to the first position.

The first step of the exemplary operational process is a workpiece automation step for placing a workpiece W in the processing assembly 10. Referring to FIG. 4, the workpiece W is received in the processing assembly 10 when the rotor assembly 24 is in a first position. Specifically, the first rotor 30 is positioned in the first (or "high") position relative to second rotor 32, which is selected for receiving or transferring a workpiece W. In the first position, the first workpiece receiving portion 40 of the first rotor 30 is located above the processing chamber 22 such that a new workpiece W can be automatically placed on the first workpiece receiving portion 40, or if a workpiece W has been processed, the workpiece W can be removed from the first workpiece receiving portion 40. When received in the first position, the contact points between the rotor assembly 24 and the workpiece W are the standoffs 60 of the first rotor 30 that contact the back side or bottom surface of the workpiece W.

Figure 1:
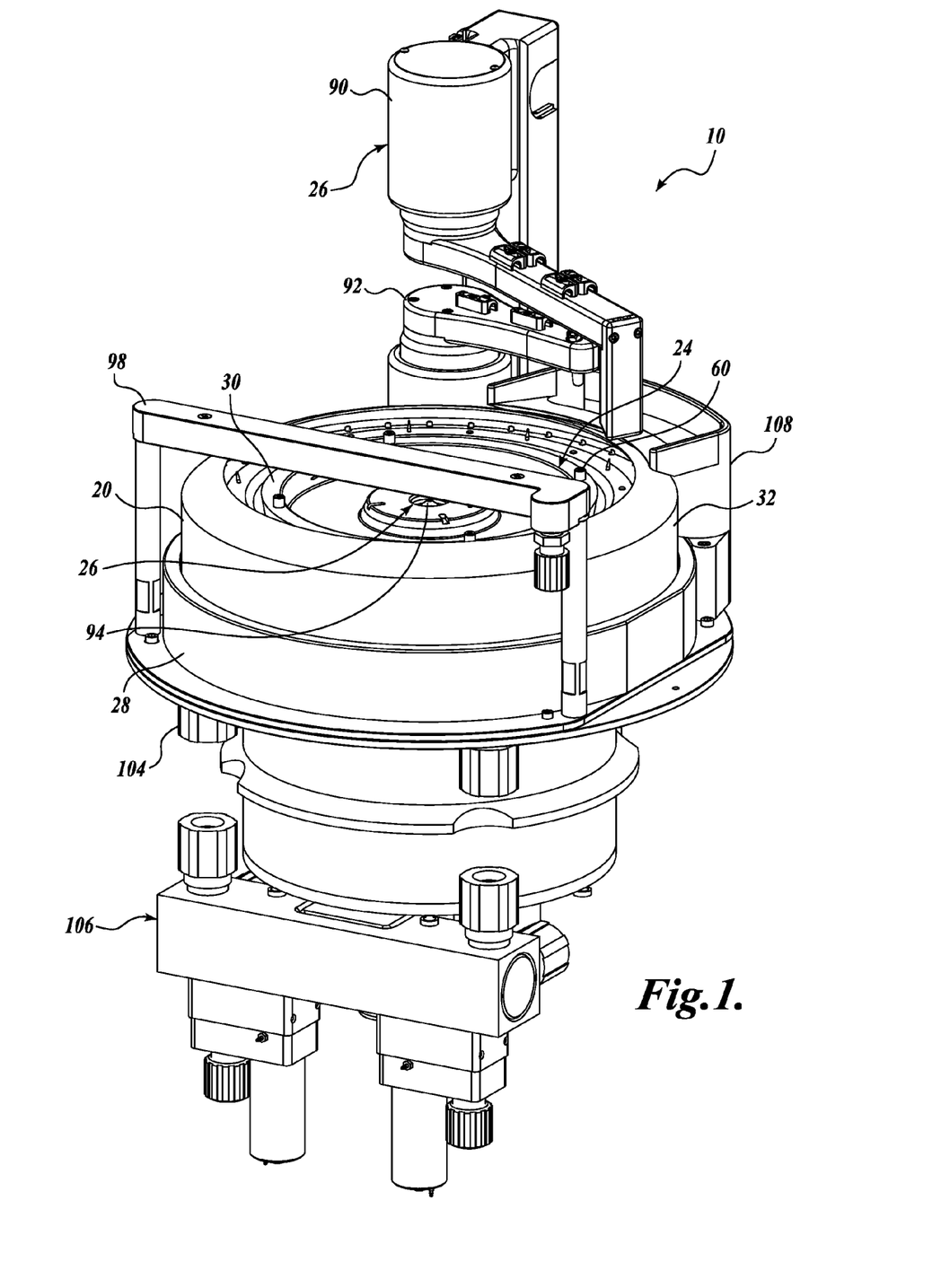
FIG. 1 is an isometric view of a processing assembly in accordance with one embodiment of the present disclosure.

Workpiece transferring to and from the processing assembly 10 may be achieved by using an automated transfer arm or paddle (not shown). Workpiece detect sensors 98, as seen in FIG. 1, are positioned to detect a workpiece W and enable automatic workpiece transfer processes. After the workpiece W has been received in the processing assembly 10, the rotor assembly 24 can be moved to a next position for processing (e.g., either of the second and third positions, as seen FIGS. 5 and 6). Such movement is achieved by manipulating the actuating assembly 36 to raise and lower the position of the first rotor 30 relative to the fixed position of the second rotor 32.

Although the illustrated embodiment shows a separate automation step (see FIG. 4), it should be appreciated that in other embodiments the workpiece W may be deposited in the processing assembly 10 in either of the second or third positions described below (see respective FIGS. 5 and 6).

The second step of the exemplary operational process is a centering and preliminary processing step. In that regard, a vortex force is generated in the cavity 58 of the first rotor 30 to force the workpiece W to the contact surfaces on the first rotor 30, then the workpiece W is moved from the first position (see FIG. 4) to the third position (see FIG. 6). When in the third position (see FIG. 6), the first rotor 30 is positioned in a "low" position relative to second rotor 32, which is selected for processing (e.g., cleaning or etching) the bottom surface (back side). When transitioning from the first position (FIG. 4) to the third position (FIG. 6), the first rotor 30 nests within the chamber 22 of the second rotor 32.

In this transition, a workpiece W is transferred from the standoffs 60 on the first rotor 30 to the guide posts 82, then standoffs 102 on the second rotor 32 such that the workpiece W is centered by the guide posts 82, then positioned on the standoffs 102.

After being centered by the guide posts 82, the workpiece W comes to rest on standoffs 102 on the second rotor 32 and is contained in the processing chamber 22 for processing (e.g., cleaning or etching). When positioned in the third position, the contact points between the second rotor 32 and the workpiece W are the guide posts 82 on the outer bevel and the standoffs 102 on the back side or bottom surface of the workpiece W. The workpiece W is no longer contacting the first rotor 30 or the first rotor standoffs 60.

In the third position, the workpiece W may be processed (e.g., cleaned or etched). In that regard, the workpiece W is set to spin using the driving assembly 34. The workpiece W back side then may be processed using, for example, the back side delivery nozzle 94 of the chemistry delivery assembly 26. Because there are masked contact areas on the back side of the workpiece W when it is positioned on the standoffs 102, this surface cannot be fully processed (e.g., cleaned or etched). Spent cleaning chemistry is collected in the chemistry collection assembly 28.

The third step of the exemplary operational process is a next processing step for the workpiece W. In that regard, the vortex force is maintained, and the rotor assembly 24 continues to spin as the workpiece W is moved from the third position (see FIG. 6) to the second position (see FIG. 5). When transitioning from the third position (FIG. 6) to the second position (FIG. 5), the first rotor 30 unnests from the second rotor 32. In this transition, the workpiece W is transferred from the standoffs 102 on the second rotor 32 to the standoffs 60 on the first rotor 30.

When in the second position (see FIG. 5), the first rotor 30 is positioned in an "intermediate" position relative to second rotor 32, which is selected for processing (e.g., cleaning or etching) the outer edge (bevel) and top surface (front side), as well as the bottom surface (back side). In the second position, the standoffs 60 of the first rotor 30 are located within the processing chamber 22 but above the standoffs 102 and centering guideposts 82 of the second rotor 32.

In the second position, the workpiece outer edge (bevel) may be processed using, for example, a short swing arm assembly 90 of the chemistry delivery assembly 26. The workpiece top surface (front side) may be processed using, for example, a long swing arm assembly 92 of the chemistry delivery assembly 26. Because there are no contacts on the bevel or the front side of the workpiece W when it is positioned on the standoffs 60, these surfaces can be fully processed (e.g., cleaned or etched). The back side of the workpiece W is also processed, to clean the areas that were masked when the workpiece W was positioned in the third position. In that regard, the standoffs 60 of the first rotor 30 contact the workpiece W in different areas than the standoffs 102 of the second rotor 32, so that the previously masked areas may be cleaned. Similar to the process when the rotor assembly 24 is in the second position, spent cleaning chemistry is collected in the chemistry collection assembly 28.

By processing or cleaning the workpiece W in both the second and third positions, all surfaces of the workpiece W are cleaned to prevent contamination of the workpiece W as a result of insufficient cleaning. In previously designed processing assemblies, unetched and uncleaned areas (i.e., masked areas) were left on the workpiece surface under the contacts required for holding the workpiece. As a result of the positionable rotor assembly 24 described herein, cleaning (including rinsing) is performed on all workpiece contact surfaces, including both back side and bevel contact points.

The fourth step of the exemplary operational process is a next processing step for the workpiece W. After being processed in both the third and second positions, the workpiece is returned to the third position for a final rinse and dry.

The fifth step of the exemplary operational process is a return to the first position for automation removal of the workpiece W from the processing assembly 10.

While illustrative embodiments have been illustrated and described, it will be appreciated that various changes can be made therein without departing from the spirit and scope of the disclosure.

The embodiments of the disclosure in which an exclusive property or privilege is claimed are defined as follows:

1. A processing assembly for a semiconductor workpiece, the processing assembly comprising:
   (a) a processing chamber;
   (b) a rotor assembly configured for spinning a workpiece within a spinning wall of a processing chamber;
   (c) a chemistry delivering assembly for delivering chemistry to the workpiece;
   (d) a chemistry collection assembly for collecting spent chemistry and exhaust from the workpiece in first and second axial positions, wherein the chemistry collection assembly includes a weir and the spinning wall, both configured to spin with the rotor assembly; and
   (e) wherein the rotor assembly comprises a first rotor comprising a first workpiece receiving portion in the first axial position within the spinning wall of the processing chamber to receive and hold the workpiece during rotation of the first rotor for processing the workpiece, the first workpiece receiving portion including a first set of fixed standoffs for receiving the workpiece, and a second rotor comprising a second workpiece receiving portion in the second axial position within the spinning wall of the processing chamber different from the first axial position to receive and hold the workpiece during rotation of the second rotor for processing the workpiece, the second workpiece receiving portion including a second set of fixed standoffs for receiving the workpiece, and wherein the rotor assembly is adjustable to change the axial spacing between the first and the second workpiece receiving portions to selectively shift the workpiece from the first workpiece receiving portion to the second workpiece receiving portion, and wherein the workpiece does not contact the second workpiece receiving portion when in the first axial position and the workpiece does not contact the first workpiece receiving portion when in the second axial position, wherein the first axial position is for cleaning and/or etching the back surface of the workpiece and wherein the second axial position is for cleaning and/or etching the bevel and top surface of the workpiece, wherein the chemistry collection assembly weir is a single weir for collecting chemistry from the workpiece when the workpiece is in the first axial position and the second axial position, and wherein the rotor assembly includes a single vortex cavity configured for maintaining the workpiece on the first and the second workpiece receiving portions.

2. The processing assembly of claim 1, wherein the first rotor is a chuck rotor and the second rotor is a centering rotor.

3. The processing assembly of claim 1, wherein the first and the second rotors are capable of nesting with each other.

4. The processing assembly of claim 1, wherein the rotor assembly includes a transmission assembly including a polymer coupling for transmitting torque, said coupling expandable in length to accommodate the change in axial spacing between the first and the second workpiece receiving portions of the first and the second rotors.

5. The processing assembly of claim 4, wherein the polymer coupling includes a foldable bellows construction.

6. The processing assembly of claim 1, wherein the rotor assembly is capable of adjusting to at least first and second positions.

7. The processing assembly of claim 6, wherein the rotor assembly is capable of adjusting to a third position.

8. The processing assembly of claim 1, wherein the weir is fixedly attached to the second rotor.

9. The processing assembly of claim 1, further comprising an actuating assembly operably coupled to one or both of the first and the second rotors for axial movement of one or both of the first and the second rotors.

10. A processing assembly for a semiconductor workpiece in a processing chamber, the processing assembly comprising:
   (a) a rotor assembly capable of spinning a workpiece within a spinning wall of the processing chamber, the rotor assembly including first and second rotors, each for receiving and holding the workpiece during rotation of the first and the second rotors, respectively, in the processing chamber, the first rotor having a first workpiece receiving portion positioned in a first axial position within the spinning wall of the processing chamber to receive and hold the workpiece during rotation of the first rotor for processing the workpiece, the first workpiece receiving portion including a first set of fixed standoffs for receiving the workpiece, and a second rotor having a second workpiece receiving portion positioned in a second axial position within the spinning wall of the processing chamber different from the first axial position to receive and hold the workpiece during rotation of the second rotor for processing the workpiece, the second workpiece receiving portion including a second set of fixed standoffs for receiving the workpiece, wherein the workpiece does not contact the second workpiece receiving portion when in the first axial position and the workpiece does not contact the first workpiece receiving portion when in the second axial position, wherein the first rotor is movable to adjust the axial spacing between a first workpiece receiving portion on the first rotor and a second workpiece receiving portion on the second rotor, and wherein the first rotor includes a vortex cavity that creates a pressure differential for forcing the workpiece on the first and the second workpiece receiving portions, and wherein the first axial position is for cleaning and/or etching the back surface of the workpiece and wherein the second axial position is for cleaning and/or etching the bevel and top surface of the workpiece;
   (b) a chemistry delivering assembly for delivery chemistry to the workpiece in the first and second axial positions; and
   (c) a chemistry collection assembly for collecting spent chemistry from the workpiece, including a weir and the spinning wall, both configured to spin with the rotor assembly, wherein the chemistry collection assembly weir is a single weir for collecting chemistry from the workpiece when the workpiece is in the first axial position and the second axial position.

11. A processing assembly for a semiconductor workpiece, the processing assembly comprising:
   (a) a rotor assembly configured for spinning a workpiece within a spinning wall of a processing chamber;
   (b) a chemistry delivery assembly for delivering chemistry to the workpiece;
   (c) a chemistry collection assembly for collecting spent chemistry and exhaust from the workpiece, wherein the chemistry collection assembly includes a weir and the spinning wall fixedly attached to the second rotor and configured to spin with the second rotor; and
   (d) wherein the rotor assembly comprises a first rotor having a first workpiece receiving portion in a first axial position within the spinning wall of the processing chamber configured to receive and hold the workpiece during rotation of the first rotor and delivery of chemistry to the workpiece for processing the workpiece, the first workpiece receiving portion including a first set of fixed standoffs for receiving the workpiece, and a second rotor having a second workpiece receiving portion in a second axial position within the spinning wall of the processing chamber different from the first axial position configured to receive and hold the workpiece during rotation of the second rotor and delivery of chemistry to the workpiece for processing the workpiece, the second workpiece receiving portion including a second set of fixed standoffs for receiving the workpiece, and wherein the rotor assembly is adjustable to change the axial spacing between the first and the second rotors to selectively shift the workpiece from the first rotor to the second rotor, and wherein the first axial position is for cleaning and/or etching the back surface of the workpiece and wherein the second axial position is for cleaning and/or etching the bevel and top surface of the workpiece, wherein the chemistry collection assembly weir is a single weir for collecting chemistry from the workpiece when the workpiece is in the first axial position and the second axial position, and wherein the rotor assembly includes a vortex cavity configured for maintaining the workpiece on the first and the second workpiece receiving portions.

12. A processing assembly for a semiconductor workpiece, the processing assembly comprising:
   (a) a rotor assembly configured for spinning a workpiece within a spinning wall of a processing chamber, wherein the rotor assembly includes first and second rotors, the first rotor having a first workpiece receiving portion in a first axial position within the spinning wall of the processing chamber configured to receive and hold the workpiece during rotation of the first rotor and delivery of chemistry to the workpiece for processing the workpiece, the first workpiece receiving portion including a first set of fixed standoffs for receiving the workpiece, the second rotor having a second workpiece receiving portion in a second axial position within the spinning wall of the processing chamber different from the first axial position configured to receive and hold the workpiece during rotation of the second rotor and delivery of chemistry to the workpiece for processing the workpiece, the second workpiece receiving portion including a second set of fixed standoffs for receiving the workpiece, configured to receive and rotate the workpiece in the processing chamber during the delivery and collection of chemistry to the workpiece for processing the workpiece, wherein the rotor assembly is adjustable to change the axial spacing between the first and the second rotors to selectively shift the workpiece between the first and the second rotors within the spinning wall of the processing chamber, wherein the rotor assembly includes a vortex cavity configured for maintaining the workpiece on the first and the second workpiece receiving portions;
   (b) a chemistry delivery assembly for delivering chemistry to the workpiece;
   (c) a chemistry collection assembly for collecting spent chemistry and exhaust from the workpiece, wherein the chemistry collection assembly includes a weir and the spinning wall, both configured to spin with the rotor assembly, wherein the weir is a single weir for collecting chemistry from the workpiece when the workpiece is in the first axial position and the second axial position; and
   (d) a transmission assembly for driving the rotor assembly, the transmission assembly including a first coupler and a second coupler, wherein the first coupler is configured to transmit torque to the first rotor directly and to the second rotor via the second coupler, wherein the second coupler is an expandable polymer coupling for transmitting torque from a driving assembly to the rotor assembly, said coupling expandable in length to accommodate the change in axial spacing between the first and the second workpiece receiving portions of the first and the second rotors.

* * * * *